(12) United States Patent
Lee

(10) Patent No.: US 6,194,289 B1
(45) Date of Patent: Feb. 27, 2001

(54) SOI DEVICE AND METHOD OF ISOLATION THEREOF

(75) Inventor: Won Chang Lee, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/343,066

(22) Filed: Jun. 29, 1999

(30) Foreign Application Priority Data

Jun. 30, 1998 (KR) .................................................. 98-25259

(51) Int. Cl.⁷ .................................................. H01L 21/76
(52) U.S. Cl. .................... 438/450; 438/444; 438/297; 438/425
(58) Field of Search .................... 438/444, 425, 438/426, 702, 232, 947, 450, 297, 452, 395, 225; 430/313, 312; 257/510, 515, 517, 374, 375

(56) References Cited

U.S. PATENT DOCUMENTS

| | | | |
|---|---|---|---|
| 4,604,162 | 8/1986 | Sobczak | 156/657 |
| 4,939,099 | 7/1990 | Seacrist et al. | 437/31 |
| 5,476,819 | 12/1995 | Warren | 437/228 |
| 5,646,053 | 7/1997 | Schepis et al. | 437/10 |
| 5,747,353 * | 5/1998 | Bashir et al. | 437/21 |
| 5,747,377 * | 5/1998 | Wu | 438/444 |
| 5,811,315 | 9/1998 | Yindeepol et al. | 437/62 |
| 5,858,621 * | 1/1999 | Yu et al. | 430/313 |
| 5,994,756 * | 11/1999 | Umezawa et al. | 257/510 |
| 6,054,368 * | 4/2000 | Yoo et al. | 438/450 |

* cited by examiner

*Primary Examiner*—Charles Bowers
*Assistant Examiner*—Laura Schillinger
(74) *Attorney, Agent, or Firm*—Ladas & Parry

(57) ABSTRACT

The present invention provides an SOI device and its isolation method capable of solving both Well-resistance and punch-through problems. To realize foregoing device, there is provided a semiconductor layer that a region in which a field oxide film having relatively wider width is formed later, is thicker than a region in which a field oxide film having relatively narrower width is formed later. Those field oxide films having different widths with an equal thickness are formed on the field regions of the semiconductor layer. Herein, the thickness of the semiconductor layer below the field oxide film having relatively wider width is thicker than the thickness of the semiconductor layer below the field oxide film having relatively narrower width owing to the fact that the semiconductor layer has various thicknesses according to the respective regions. Accordingly, the Well-resistance at the field oxide film region having relatively wider width is reduced and the punch-through problem at the field oxide film region having relatively narrower width is prevented.

9 Claims, 9 Drawing Sheets

SOI DEVICE AND METHOD OF ISOLATION THEREOF

BACKGROUND OF THE INVENTION

1. Field of the Invention

The present invention generally relates to a silicon-on-insulator(SOI) device, and more particularly to a body-contacted-SOI(BC-SOI) device in which a field oxide film is not contacted with a buried oxide layer and method of isolating thereof.

2. Description of the Related Art

Due to the fast development in semiconductor device industry, a semiconductor device using the SOI substrate instead of a single crystalline silicon substrate made of bulk silicon, has been proposed. The SOI substrate has a stack structure comprising a base layer as a means for supporting, a buried oxide layer, and a semiconductor layer in which a device is formed later. According to this SOI device, adjoining devices are completely isolated from each other and a reduction of the junction capacitance can be obtained, therefore a low power and high speed device can be manufactured.

FIG. 1 is a cross-sectional view showing a conventional SOI device in which a transistor is formed on an SOI substrate. As shown in the drawing, there is provided the SOI substrate 10 comprising a base layer 1, a buried oxide layer 2 and a semiconductor layer 3. Field oxide films 4a,4b are formed to be contacted with the buried oxide layer 2 in a field region of the semiconductor layer 3. A gate oxide layer 5 and a gate electrode 6 of a transistor 20 are formed in an active region of the semiconductor layer 3 that is defined by those field oxide films 4a,4b. Junction regions 7 such as source and drain regions are formed at active regions of both sides of the gate electrode 6 respectively. Herein, the junction regions 7 are formed to be contacted with the buried oxide layer 2, similar to the field oxide films 4a,4b.

The SOI device as constituted above, may reduce the junction capacitance and the SOI device may be driven with high speed compared to the semiconductor device formed on a silicon substrate since the junction regions are contacted with the buried oxide layer. The SOI device has properties suitable for devices with high speed, however, there is occurred "Floating Body Effect" thereby degrading the operational property.

More particularly, when the transistor formed on the silicon substrate is driven, a body bias is applied to prevent from storing electric charges at a channel region beneath the gate electrode thereby obtaining stabilization in the device operation. However, when the SOI device is driven, since an active region of the semiconductor layer in which the transistor is formed, is floated by the field oxide films and the buried oxide layer, the body bias can not be applied to the active region unless they are equipped with extra device. Consequently, the SOI device has instability of operational property due to the electric charges being stored at the channel region.

Accordingly, to prevent the floating body effect with maintaining those advantages suitable for the devices of high speed and low power, there is proposed the BC-SOI device as disclosed in "Body-Contacted SOI MOSFET structure with fully bulk CMOS compatible layout and process" by Y. H. Koh, J. H. Choi, M. H. Nam and J. W. Yang, IEEE Electron Device Lett., vol. 18, pp. 102~104, 1997.

FIG. 2 is a cross-sectional view showing the SOI device. Herein, the same reference numerals are used in the same part of FIG. 2 as in FIG. 1. As shown in the drawing, field oxide films 4c,4d are formed with a depth that is not contacted with the buried oxide layer 2. Furthermore, a diffusion area 8 for well-pick up is provided at a selected portion of the semiconductor layer so that electrical potential of the channel in transistors 20 is controlled. The diffusion area 8 is a doped region with the same conductivity type impurities of an active region of the semiconductor layer 3 i.e. at the body of the transistor. The reference numeral 1 which is not described yet, stands for a base layer, 5 for a gate insulating layer, 6 for a gate electrode, 7 for a junction region and 10 for an SOI substrate.

Also, although not shown in the drawings, a well is provided within the semiconductor layer 3. A semiconductor device is generally a CMOS circuit comprising of NMOS and PMOS, therefore a body of the NMOS may become a P-well and a body of the PMOS may become an N-well.

In the SOI device as described above, since the field oxide film is not contacted with the buried oxide layer, body-floating of the transistors may be prevented. Accordingly, those advantages applicable to the high speed and low power device may be obtained.

However, following drawbacks are also occurred by the BS-SOI device. It is required to thicken the thickness of the field oxide film so as to obtain high quality of isolation property, in other words, to prevent the punch-through problem. When the field oxide film is thick, even though the high quality of isolation property may be obtained, however there is an increase in the Well-resistance since thickness of the semiconductor layer existing between the field oxide film and the buried oxide layer is relatively decreased, therefore instability in the body bias of the transistors is occurred and there is even occurred the floating body effect. While, in case the thickness of the semiconductor layer remained in the lower portion of the field oxide film is increased to reduce the Well-resistance, the punch-through characteristic is degraded due to a decrease of thickness of the field oxide film.

On the other hand, as shown in FIG. 2, the field oxide films 4c,4d are formed with different widths while having the same thickness, and at this time a first distance $L_A$ between a first field oxide film 4c having a first width and the buried oxide layer 2, and a second distance LB between a second field layer 4d having a second width that is relatively narrower than the first width and the buried oxide layer 2 are equal to each other. However, there is a problem of the Well-resistance rather than the punch-through characteristics in the first field oxide region 4c having relatively wider width, and to the contrary there is a problem of the punch-through characteristics rather than the Well-resistance in the second field oxide region 4d having relatively narrower width.

Accordingly, it is difficult to satisfy both Well-resistance and punch-through characteristics in the SOI device since the problem of punch-through characteristics is occurred in the field oxide film having relatively narrower width when the thickness of the field oxide film is decreased, and to the contrary the problem of Well-resistance is occurred in the field oxide film having relatively wider width when the thickness of the field oxide film is increased.

SUMMARY OF THE INVENTION

It is one object of the present invention to provide an SOI device capable of solving the Well-resistance and the punch-though characteristics.

It is another object of the present invention to provide a method of isolation of the SOI device capable of solving the Well-resistance and the punch-though characteristics.

To accomplish foregoing objects, the present invention provides an SOI device comprising:

an SOI substrate having a stack structure of a base layer, a buried oxide layer disposed on the base layer, and a semiconductor layer disposed on the buried oxide layer;

first field oxide films having a first width and second field oxide films having a second width which is narrower than the first width, both formed on the semiconductor layer at a depth spaced with the buried oxide layer; and a transistor formed at an active region of the semiconductor layer defined by the first and second field oxide films, wherein a region that the first field oxide film is formed, is thicker than other regions in the semiconductor layer, and a distance between the first field oxide films and the buried oxide layer is larger than a distance between the second field oxide film and the buried oxide layer.

The present invention also provides a method of isolating SOI device comprising the steps of:

providing an SOI substrate having a stack structure of a base layer, a buried oxide layer disposed on the base layer, and a semiconductor layer on the buried oxide layer, wherein the semiconductor layer has first field oxide regions having a first width and second field oxide regions having a second width which is narrower than the first width;

removing a selected thickness of the semiconductor layer excluding the first field region;

forming an isolation mask by masking active regions between those field regions which are adjacent each other on the semiconductor layer and by exposing the first and second field regions;

forming first field oxide films having a first width and second field oxide films having a second width which is narrower than the first width by oxidizing the exposed first and second field regions; and removing the isolation mask.

Furthermore, the present invention still provides a method of isolating SOI device comprising the steps of:

providing an SOI substrate having a stack structure of a base layer, a buried oxide layer disposed on the base layer, and a semiconductor layer on the buried oxide layer, wherein the semiconductor layer has first field oxide regions having a first width and second field oxide regions having a second width which is narrower than the first width;

removing a selected thickness of the semiconductor layer region excluding the first field region;

forming an isolation mask by masking active regions between those field regions which are adjacent each other on the semiconductor layer and by exposing the first and second field regions;

forming a first trench having a first width and a second trench having a second width which is narrower than the first width by removing equally the first and second field regions of the exposed semiconductor layer as much as a selected thickness according to a dry etching process using the isolation mask, wherein both trenches are spaced with the buried oxide layer;

forming first and second field oxide films by filling the first and second trenches with an insulating layer; and removing the isolation mask.

BRIEF DESCRIPTION OF THE DRAWINGS

These and other features of the present invention can be readily understood with reference to the accompanying drawings.

DETAILED DESCRIPTION OF THE INVENTION

A detailed description of the preferred embodiment is made with reference to the attached drawings.

FIGS. 3A to 3E are cross-sectional views showing an isolation process of an SOI device according to one embodiment of the present invention.

Figure 1:
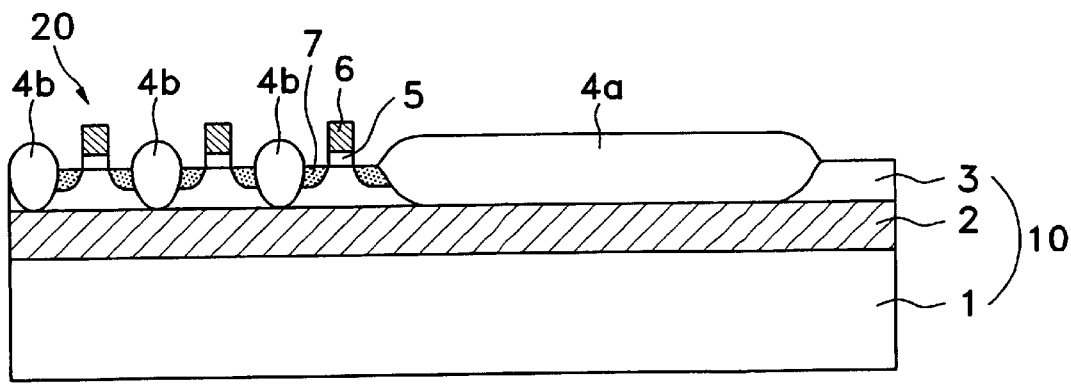
FIG. 1 is a cross-sectional view showing a conventional SOI device.
Figure 2:
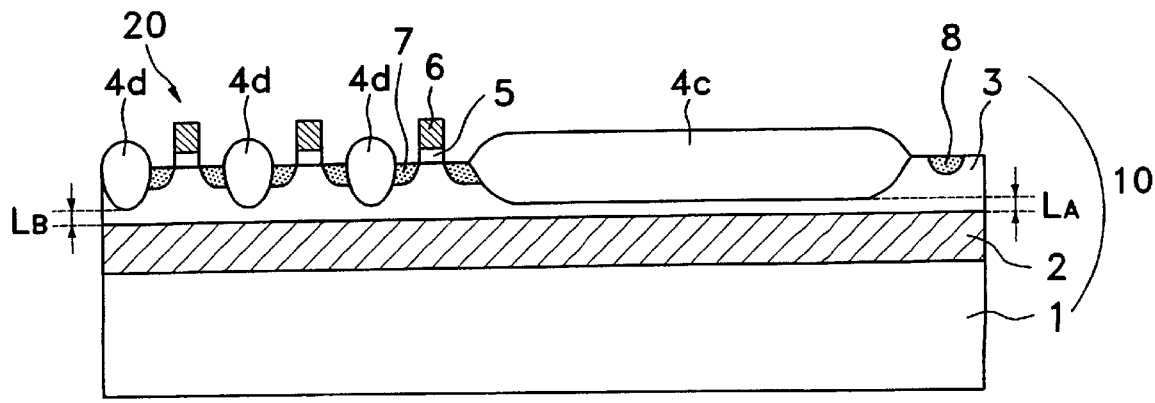
FIG. 2 is a cross-sectional view showing a conventional SOI device.
Figure 3A:
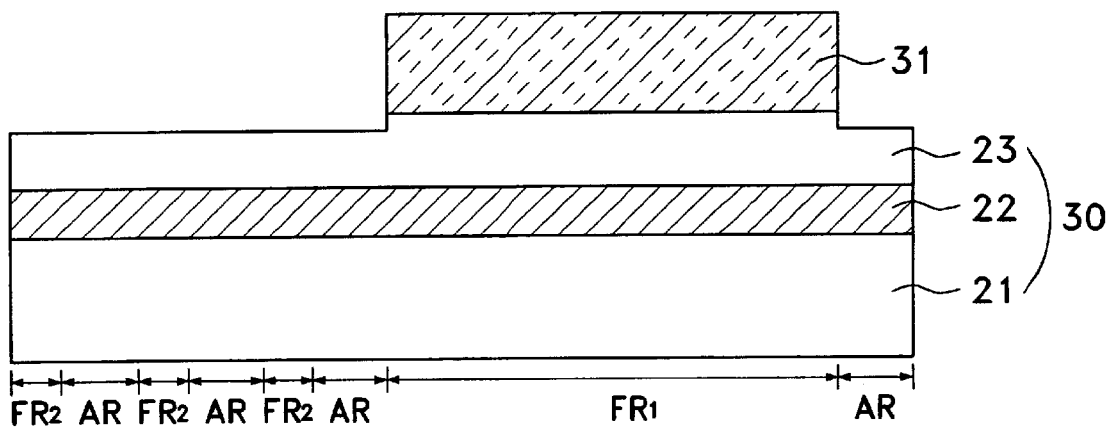
FIGS. 3A to 3E are cross-sectional views showing an isolation process of an SOI device according to one embodiment of the present invention.

FIG. 3A is a cross-sectional view showing a semiconductor layer of SOI substrate that is selectively etched. As shown in the drawing, there is provided an SOI substrate 30 having a stack structure comprising of a base layer 21, a buried oxide layer 22, a semiconductor layer 23 having first field oxide regions of a first width and second field oxide regions of a second width which is narrower than the first width. A photoresist pattern 31 is formed in a first field region $FR_1$ of the semiconductor layer 23 having relatively wider width, and then a selected thickness of other regions excluding the first field region $FR_1$, i.e. a second field oxide region $FR_2$ and an active region AR are removed by a dry etching process using the photoresist pattern 31 as an etching mask.

Figure 3B:
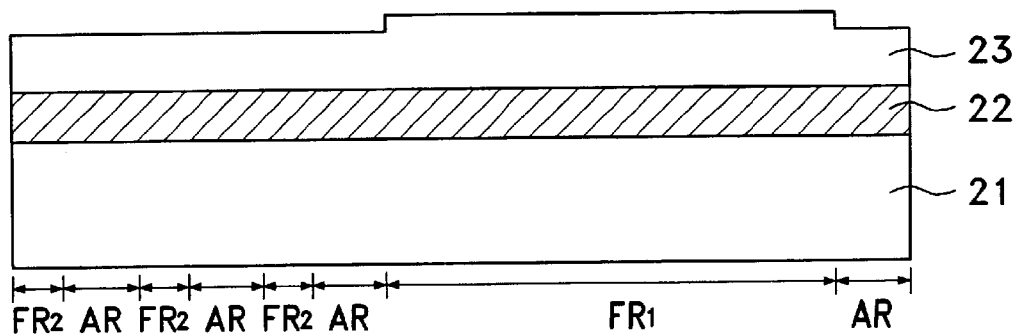

FIG. 3B is a cross-sectional view showing a state that the photoresist pattern is removed. As shown in the drawing, the semiconductor layer 23 has various thicknesses according to the respective regions. Herein, the first field region $FR_1$ having relatively wider width is thicker than the region including the second field region $FR_2$ having relatively narrower width.

Figure 3C:
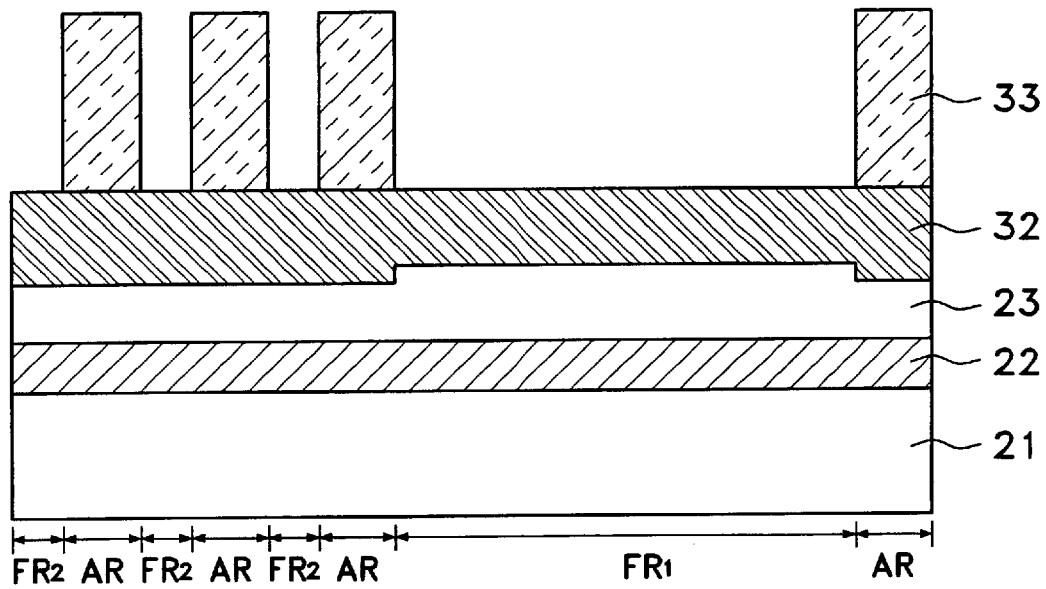
Figure 3D:
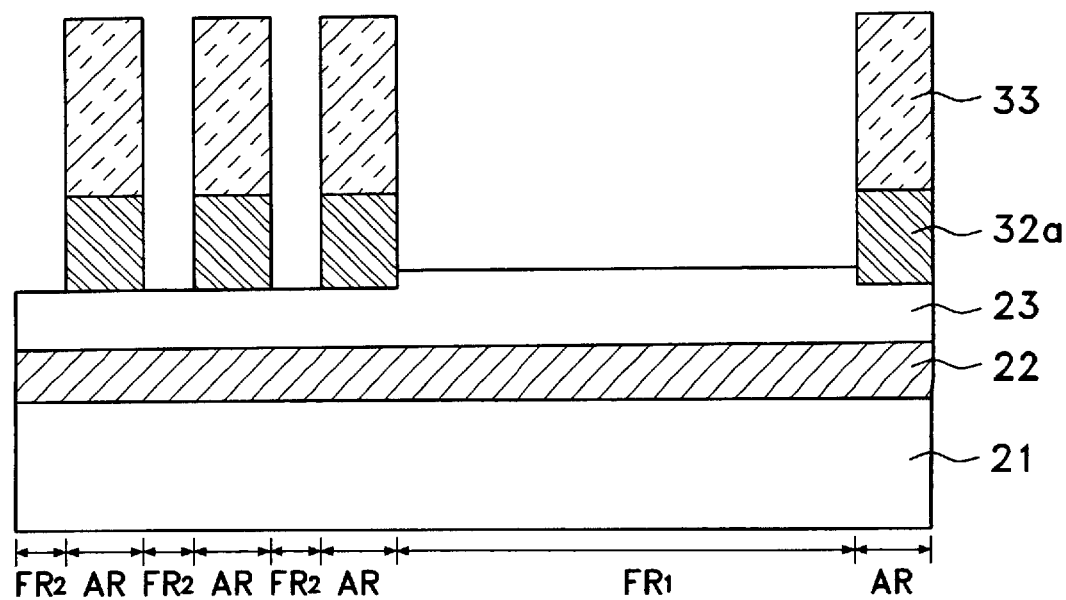

FIGS. 3C and 3D are cross-sectional views showing a method of forming isolation oxide("ISO") mask. Referring to FIG. 3C, a nitride layer 32 is formed on the semiconductor layer 23 having various thicknesses according to the respective regions and an etching mask such as a photoresist pattern 33 is formed on the nitride layer 32 so that the nitride layer portions disposed on the first and second field regions $FR_1$ and $FR_2$ of the semiconductor layer 23 are exposed. Next, referring to FIG. 3D, the exposed nitride layer portions are removed by a dry etching process using the photoresist pattern 33 as an etching mask thereby forming an ISO mask 32a for masking its active region AR on the semiconductor layer 23.

Figure 3E:
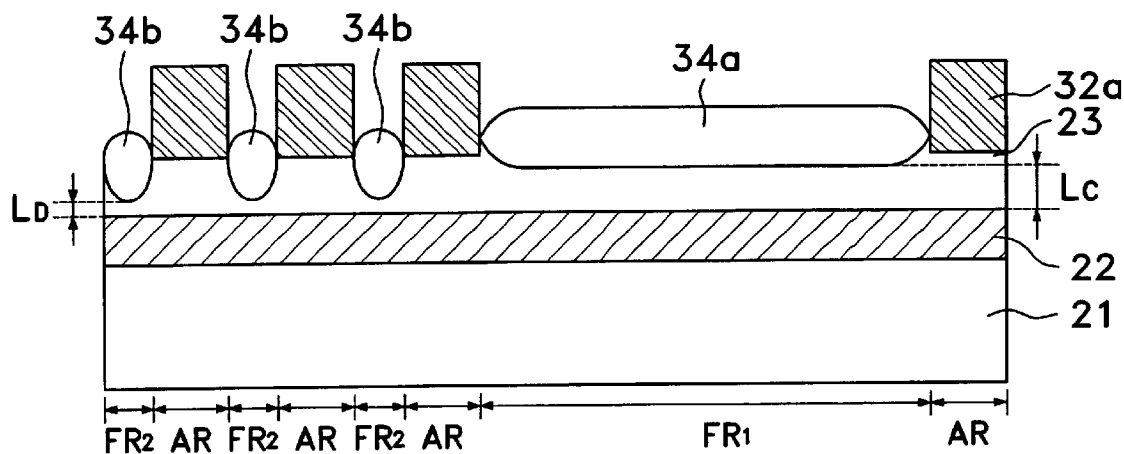

FIG. 3E is a cross-sectional view showing a state that the photoresist pattern is removed and then first and second field oxide films are formed at the respective first and second field regions of the semiconductor layer. As shown in the drawing, the first and second field oxide films 34a,34b are formed by applying thermal oxidation selectively to the first and second field regions $FR_1$, $FR_2$ of the exposed semiconductor layer 23. At this time, the first and second field oxide films 34a,34b are formed with a thickness that is not contacted with the buried oxide layer 22, and more particularly they have difference in width but have an equal thickness. Herein, since the first field region $FR_1$ of the semiconductor layer 23 in which the first field oxide film 34a is formed, is thicker than the second field regions $FR_2$ of the semiconductor layer 23 in which the second field oxide film 34b is formed, a distance $L_c$ between the first field oxide film 34a and the buried oxide layer 22 is larger than a distance $L_D$ between the second field oxide film 34b and the buried oxide layer 22.

Figure 4:
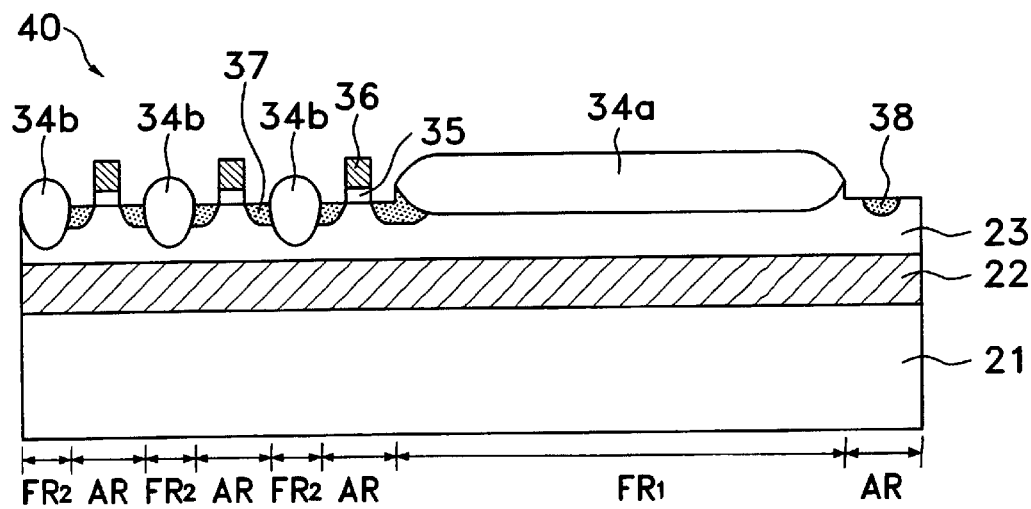
FIG. 4 is a cross-sectional view showing the SOI device according to one embodiment of the present invention.

FIG. 4 is a cross-sectional view showing an SOI device in which a transistor is formed at the active region AR of the semiconductor layer 23 after the ISO mask as shown in FIG. 3E is removed. As shown in the drawing, a gate electrode 36 having a gate oxide layer 35 at a lower portion thereof, is formed on the active region AR of the semiconductor layer 23 defined by the first and second field oxide films 34a,34b and a junction region 37 such as the source/drain region is formed within a portion of the active regions AR of both sides of the gate electrode 36. Furthermore, a diffusion area 38 for well-pick up is provided at a selected portion of the semiconductor layer so that electrical potential of the channel in transistors is controlled. The diffusion area 38 is a doped region with the same conductivity type impurities of an active region of the semiconductor layer 23 i.e. the same conductivity type with the body of the transistor.

In the SOI device as constituted above, thickness of the semiconductor layer 23 remained at a lower portion of the first field oxide films 34a having relatively wider width is increased. To the contrary, thickness of the semiconductor layer 23 remained at a lower portion of the second field oxide film 34b having relatively narrower width is decreased. Therefore, the Well-resistance in a region including the first field oxide film 34a is reduced and the punch-through characteristic in a region the second oxide layer 34b is improved.

Accordingly, the present invention may solve those problems of the Well-resistance and the punch-through at the respective regions as described above simultaneously. Therefore, the SOI device of the present invention is suitable for the device with high speed and low power. The SOI device also ensures stability in operations of the device with high speed and low power.

FIGS. 5A to 5D are cross-sectional views for showing the isolation process of an SOI device according to another embodiment of the present invention. In the SOI device of the present embodiment, the field oxide film is formed according to a trench technique. Herein, the process of forming a semiconductor layer having various thicknesses according to the respective regions will be omitted and subsequent processes thereof will be discussed hereinafter.

Figure 5A:
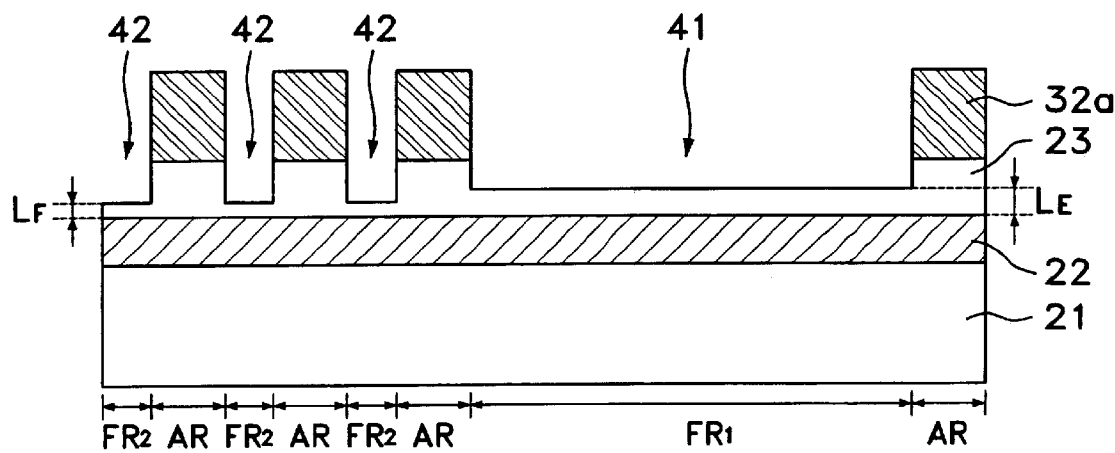
FIGS. 5A to 5D are cross-sectional views showing an isolation process of an SOI device according to another embodiment of the present invention.

Referring to FIG. 5A, first and second trenches 41,42 are formed at the first and second field regions $FR_1$, $FR_2$ of an exposed semiconductor layer 23 with a thickness that is not contacted with a buried oxide layer 22 by a dry etching process using an ISO mask 32a as an etching mask. Herein, the first and second trenches 41,42 are formed by etching the first and second field regions $FR_1$, $FR_2$ of the semiconductor layer at equal depth. At this time, since the first field region $FR_1$ of the semiconductor layer 23 in which the first trench 41 is formed, is thicker than the second field region $FR_2$ of the semiconductor layer 23 in which the second trench 42 is formed, a distance $L_E$ between a bottom surface of the first trench 41 and the buried oxide layer 22 is larger than a distance $L_F$ between a bottom surface of the second trench 42 and the buried oxide layer 22.

Figure 5B:
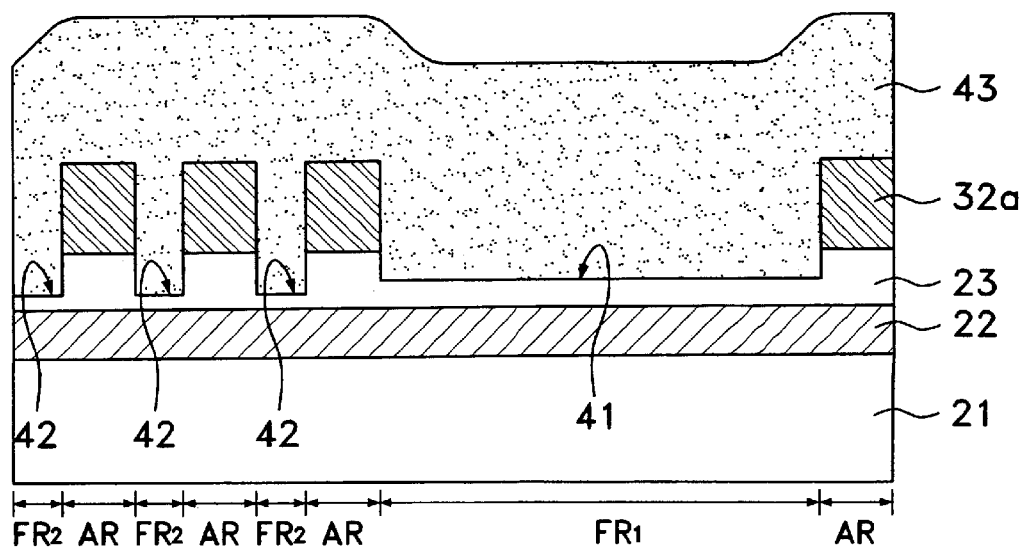
Figure 5C:
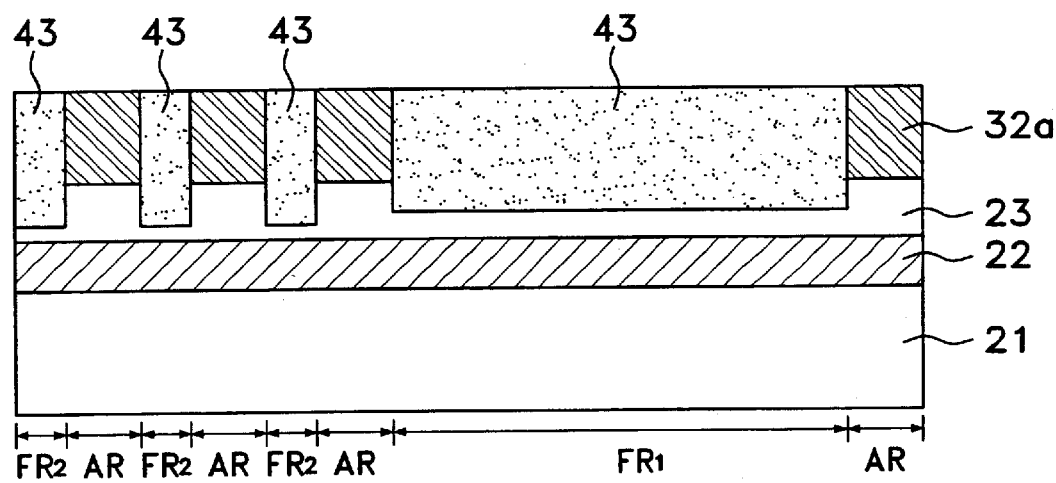

Referring to FIG. 5B, an insulating layer 43 is deposited with a thickness sufficient to fill the first and second trenches 41,42. Referring to FIG. 5C, the insulating layer 43 is etched according to the etch-back or the chemical mechanical polishing(CMP) process until the ISO mask 32a is exposed.

Figure 5D:
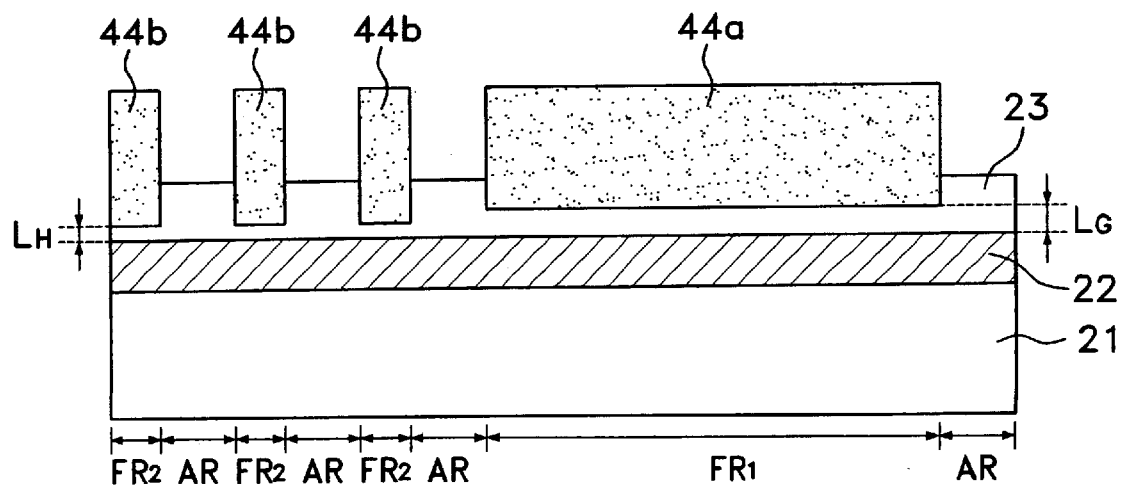

Referring to FIG. 5D, the ISO mask 32a is removed. As a result, first and second field oxide films 44a,44b of trench type are formed at the first and second field regions $FR_1$, $FR_2$ of the semiconductor layer 23 respectively. At this time, since the first and the second field oxide films 44a,44b are formed within the respective trenches 41,42, a distance $L_G$ between the first field oxide film 44a and the buried oxide layer 22 is larger than a distance $L_H$ between the second field oxide film 44b and the buried oxide layer 22. As a result, the semiconductor layer 23 remained between the first field oxide film 44a and the buried oxide layer 22 is thicker than the semiconductor layer 23 remained between the second field oxide film 44b and the buried oxide layer 22.

Accordingly, similar to the previous embodiment, the Well-resistance in the region of the first field oxide film 44a is reduced and the punch-through in the region of the second field oxide film 44b is prevented.

As described above, the present invention may solve those problems of the Well-resistance in the region including a field oxide film of relatively wider width and the punch-through characteristic in the region including a field oxide film of relatively narrower width simultaneously. Accordingly, the SOI device of the present invention is suitable for the device with high speed, and the SOI device ensures stability in operations of the device with high speed, and the SOI device also improves reliability thereof.

Figure 6A:
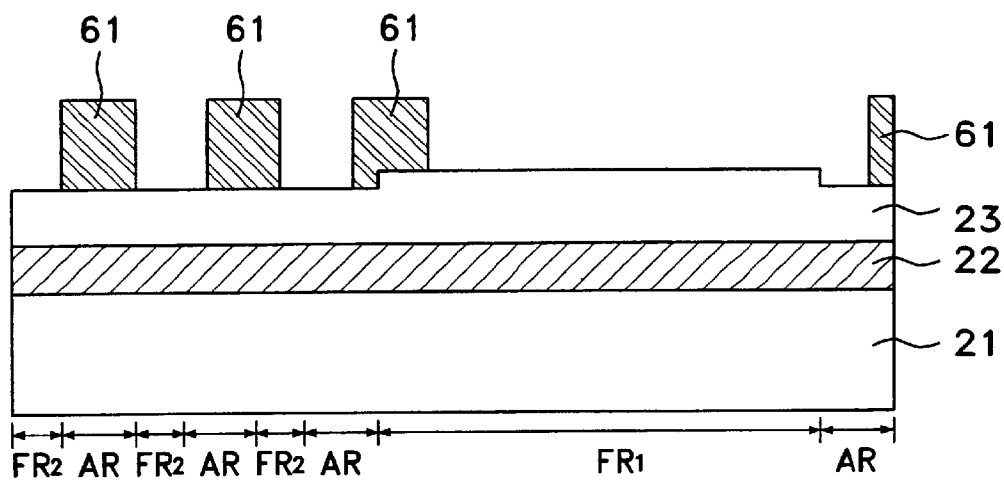
FIG. 6A is a cross-sectional view showing misalignment of an isolation mask.

FIG. 6A is a cross-sectional view showing misalignment of an ISO mask. As shown in the drawing, the ISO mask 61 is also formed at those field regions $FR_1$, $FR_2$ despite that the ISO mask 61 should be formed within the active region AR. This is originated from the misalignment of exposing equipment during a lithography process for forming the ISO mask 61.

Figure 6B:
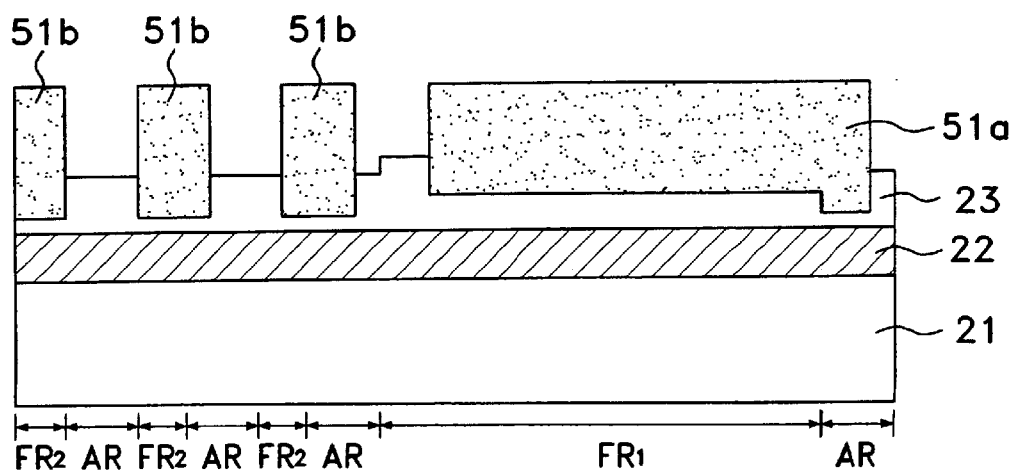
FIG. 6B is a cross-sectional view showing first and second field oxide films formed under the misalignment state.

During the subsequent processes, such as processes for forming trenches or filling insulating layer by employing the mis-aligned ISO mask, there is however occurred a step difference at the active region AR defined by a first field oxide film 51a and its adjoining second field oxide film 51b since the first filed oxide layer 51a is disposed at the wrong position as shown in FIG. 6B. As a result, following processes, such as junction or contact process is difficult to perform.

Accordingly, the present invention further provides a method for preventing the defect originated from the misalignment of the ISO mask. This method is accomplished by modifying a reticle for forming ISO mask for forming ISO mask.

Figure 7:
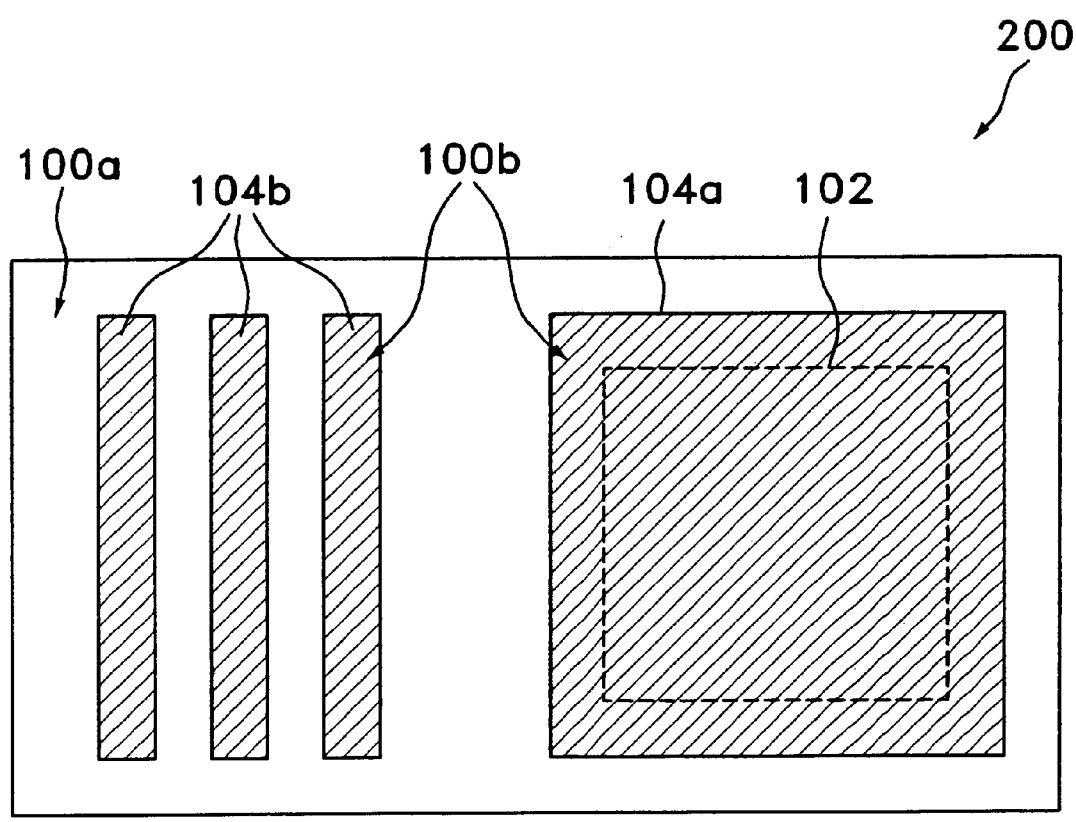
FIG. 7 is a plan view showing a reticle for forming isolation mask for preventing the misalignment of the isolation mask.

FIG. 7 is a plan view showing a reticle for forming the ISO mask according to another embodiment of the present invention. Herein, the reference numeral 100a stands for a blocking region, 100b for a transmitting region, 102 for the substantial first field region in the semiconductor layer, 104a for a first exposing region for exposing the first field region and its adjoining active region, 104b for a second exposing region for exposing active regions between the second field region, and 200 for a reticle for forming ISO mask.

In another embodiment of the present invention, when the exposing process is performed with the reticle for forming ISO mask as described above, a photoresist of negative type will be used.

Figure 8A:
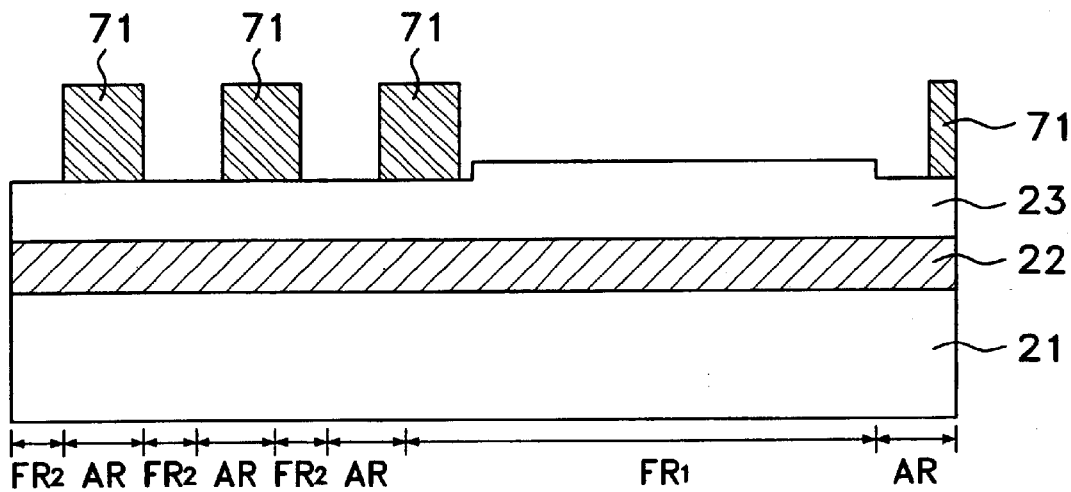
FIGS. 8A and 8B are cross-sectional views showing an isolation process of an SOI device according to another embodiment of the present invention.
Figure 8B:
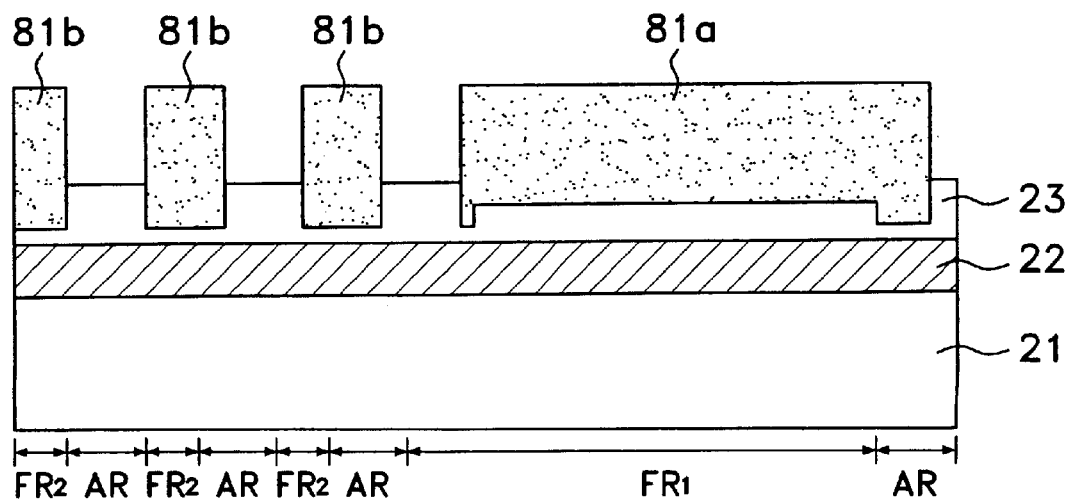

FIG. 8A is a cross-sectional view showing an ISO mask formed by using the reticle for forming ISO mask. FIG. 8B is a cross-sectional view showing field oxide films formed by subsequent process. First of all, a first exposing region 104*a* of the reticle 200 for forming ISO mask is provided to expose larger region than the substantial first field region. Although there is occurred misalignment during the photolithography process, the ISO mask 71 for exposing the first field region $FR_1$ as shown in FIG. 8A exposes larger region than the first field region $FR_1$.

Accordingly, when the subsequent processes are carried out under the above circumstances, the defect originated from the misalignment as shown in FIG. 8B may be prevented, i.e. the step difference at the active region AR defined by the first field oxide film 81*a* and its adjoining second field oxide film 81*b* may be prevented. As a result, there is not occurred such a defect that causes difficulties in the subsequent processes.

As disclosed in the specification, the present invention provides a method to solve those problems of Well-resistance and punch-through by simply varying the thickness of the semiconductor layer. Accordingly, the device according to the present invention is applicable to manufacturing processes of high speed device advantageously.

Various other modifications will be apparent to and can be readily made by those skilled in the art without departing from the scope and spirit of the present invention.

What is claimed is:

1. A method of isolating an SOI device comprising the steps of:

providing an SOI substrate having a stack structure of a base layer, a buried oxide layer disposed on the base layer, and a semiconductor layer on the buried oxide layer, wherein the semiconductor layer has first field regions having a first width and second field regions having a second width which is narrower than the first width;

removing a selected thickness of the semiconductor layer excluding the first field regions;

forming an isolation mask by masking active regions between those filed regions which are adjacent each other on the semiconductor layer and by exposing the first and second field regions;

forming first field oxide films having a first width and second field oxide films having a second width which is narrower than the first width by oxidizing the exposed first and second field regions; and removing the isolation mask.

2. The method of claim 1, wherein the isolation mask is made of a nitride layer.

3. The method of claim 2, wherein the step of forming the isolation mask comprises the steps of:

depositing a nitride layer on the semiconductor layer of the SOI substrate;

forming a photoresist pattern for masking the active region of the semiconductor layer on the nitride layer;

removing the exposed nitride layer region by a dry etching process using the photoresist pattern; and removing the photoresist pattern.

4. The method of claim 1, wherein the isolation mask exposes larger region than the first field region.

5. A method of isolating an SOI device comprising the steps of:

providing an SOI substrate having a stack structure of a base layer, a buried oxide layer disposed on the base layer, and a semiconductor layer on the buried oxide layer, wherein the semiconductor layer has first field regions having a first width and second field regions having a second width which is narrower than the first width;

removing a selected thickness of the semiconductor layer excluding the first field regions;

forming an isolation mask by masking active regions between those field regions which are adjacent each other on the semiconductor layer and by exposing the first and second field regions;

forming first trenches having a first width and second trenches having a second width which is narrower than the first width by removing equally the exposed first and second field regions of the semiconductor layer as much as a selected thickness according to a dry etching process using the isolation mask, wherein both trenches are spaced with the buried oxide layer;

forming first and second field oxide films by filling the first and second trenches with an insulating layer; and removing the isolation mask.

6. The method of claim 5, wherein the isolation mask is made of a nitride layer.

7. The method of claim 6, wherein the step of forming the first and second field oxide films comprises the steps of:

depositing an insulating layer with a thickness sufficient to fill the first and second trenches on the overall surface of a resultant; and etching the insulating layer until the isolation mask is exposed.

8. The method of claim 7, wherein the step of etching the insulating layer is performed according to an etch-back or a chemical mechanical polishing(CMP) process.

9. The method of claim 5, wherein the isolation mask exposes larger region than the first field region.

* * * * *